United States Patent
Shibata et al.

(10) Patent No.: US 6,759,715 B2
(45) Date of Patent: Jul. 6, 2004

(54) EPITAXIAL BASE SUBSTRATE AND EPITAXIAL SUBSTRATE

(75) Inventors: Tomohiko Shibata, Kasugia (JP); Mitsuhiro Tanaka, Handa (JP); Osamu Oda, Nishikasugai-gun (JP); Yukinori Nakamura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 3 days.

(21) Appl. No.: 10/042,949

(22) Filed: Jan. 9, 2002

(65) Prior Publication Data
US 2002/0093055 A1 Jul. 18, 2002

(30) Foreign Application Priority Data

Jan. 15, 2001 (JP) .................................. 2001-005944
Dec. 20, 2001 (JP) .................................. 2001-387772

(51) Int. Cl.$^7$ .............................................. H01L 29/72
(52) U.S. Cl. .................... 257/352; 257/354; 257/355; 257/358
(58) Field of Search ........................... 257/96, 97, 76, 257/103, 352, 354, 355, 358

(56) References Cited

U.S. PATENT DOCUMENTS 6,153,894 A * 11/2000 Udagawa ...................... 257/96
2002/0005593 A1 * 1/2002 Bourret-Courchesne .... 257/790

* cited by examiner

Primary Examiner—Edward Wojciechowicz
(74) Attorney, Agent, or Firm—Burr & Brown

(57) ABSTRACT

A III nitride buffer film including at least Al element and having a screw-type dislocation density of $1 \times 10^8 / cm^2$ or less is formed on a base made from a sapphire single crystal, etc., to fabricate an epitaxial base substrate. Then, a III nitride underfilm is formed on the III nitride buffer film, to fabricate an epitaxial substrate.

19 Claims, 1 Drawing Sheet

EPITAXIAL BASE SUBSTRATE AND EPITAXIAL SUBSTRATE

This application claims priority from Japanese Application 2001-005,944, filed Jan. 15, 2001, and Japanese Application 2001-387,772, filed Dec. 20, 2001, the entireties of which are incorporated herein by reference.

BACKGROUND OF THE INVENTION

1. Field of the Invention

This invention relates to an epitaxial base substrate and an epitaxial substrate, particularly usable as an epitaxial substrate and the base of the epitaxial substrate for a semiconductor light-emitting element made of a plurality of III nitride films.

2. Related Art Statement

III nitride films are used as semiconductor films for light-emitting diodes, and recently get attention as semiconductor films for high speed IC chips.

Such a III nitride film is formed as follows. First, a buffer film is formed from a III nitride material on a substrate made of a single crystal material, and an underlayer is formed from a III nitride material on the buffer film. Then, one or more III nitride films having their respective functions are formed on the underlayer, to fabricate a semiconductor element such as a light-emitting diode. Generally, the substrate, and the buffer film and the underlayer are combined, and called an "epitaxial substrate".

The III nitride films encompassing the buffer film and the underlayer are usually made by MOCVD methods. In the case of making such an epitaxial substrate by MOCVD methods, however, the epitaxial substrate may be warped largely. Also, this trend becomes conspicuous as the buffer film is made of a III nitride material including much Al element, particular AlN.

Practically, if the buffer film is made of AlN, the warpage of the epitaxial substrate is increased up to 70 $\mu$m, and thus, in the manufacturing process of semiconductor elements encompassing various semiconductor films formation processes, the photolithography process can not be performed precisely, so that the manufacturing yield ratio of semiconductor element can be deteriorated.

SUMMARY OF THE INVENTION

It is an object of the present invention to provide an epitaxial base substrate by which a not much warped epitaxial substrate can be provided, and an epitaxial substrate including the epitaxial base substrate.

In order to achieve the above object, this invention relates to an epitaxial base substrate comprising:

a base made of a single crystal material, and a III nitride film including at least Al element and having a screw-type dislocation density of $1\times10^8/cm^2$ or below which is formed on said base.

Also, this invention relaxes to an epitaxial substrate comprising:

a base made of a single crystal material, a III nitride buffer film including at least Al element and having a screw-type dislocation density of $1\times10^8/cm^2$ or below which is formed on said base, and a III nitride underfilm which is formed on said III nitride buffer film.

The inventors had intensely studied to find out the cause of the increase in warpage of the epitaxial substrate as being fabricated by a MOCVD method. As a result, they found out the following fact of the matter.

In the past, a buffer film of an epitaxial substrate is formed at a lower temperature within 500–700° C. so as to mitigate the difference in lattice constant between a substrate and an underfilm, and thus, enhance the buffer effect. Therefore, the crystal quality may be degraded to some degree, and large dislocation of a density of $10^9/cm^2$ or more may be created therein.

On the contrary, the inventors found out that, if the buffer film is made of a nitride including Al element and a given III nitride film is formed on the buffer film, surprisingly, the warpage of the thus obtained multilayered structure is reduced remarkably even though the dislocation density of the buffer film is reduced and thus, the crystal quality of the buffer film is developed.

Moreover, the buffer film made of the Al-including nitride can exhibit a sufficient buffer effect even though the crystal quality is developed to some degree.

The present invention is achieved by the prominent attention of the inventors which breaks down conventional ideas.

According to the epitaxial base substrate and the epitaxial substrate of the present invention, the warpage of a given multilayered structure made of a substrate and a III nitride film can be reduced, as compared with a conventional one. Therefore, when various III nitride films having their respective functions are formed on the III nitride film as an underlayer, the warpage of the resulting multilayered structure can be reduced up to 50 $\mu$m or below.

Therefore, in the lithograph step of the manufacturing process of a semiconductor element, a multilayered substrate of e.g., a base substrate, a buffer film and an underlayer can be set to a desired position precisely, so the lithograph step can be performed precisely. As a result, the manufacturing yielding ratio of the semiconductor element can be developed remarkably.

The term "warpage" means a "warpage amplitude" of a multilayered structure such as an epitaxial base substrate and an epitaxial substrate if the multilayered structure is warped convexly or concavely, as shown in FIG. 1, and a "maximum warpage amplitude" thereof if the multilayered structure is warped in a wave shape.

BRIEF DESCRIPTION OF THE DRAWINGS

For better understanding of the present invention, reference is made to the attached drawings, wherein.

DETAILED DESCRIPTION OF THE INVENTION

Figure 1:
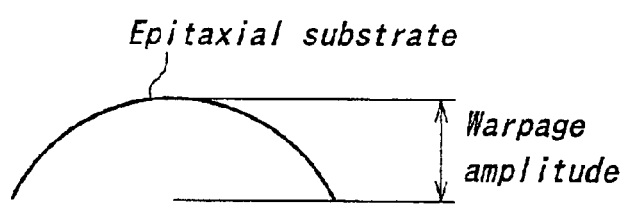
FIG. 1 is an explanatory view to define a warpage of an epitaxial substrate.
Figure 2:
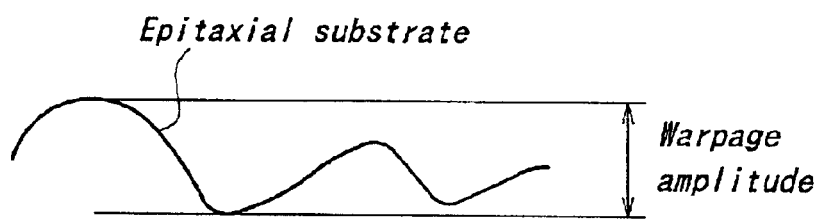
FIG. 2 is another explanatory view to define a warpage of an epitaxial substrate.
Figure 3:
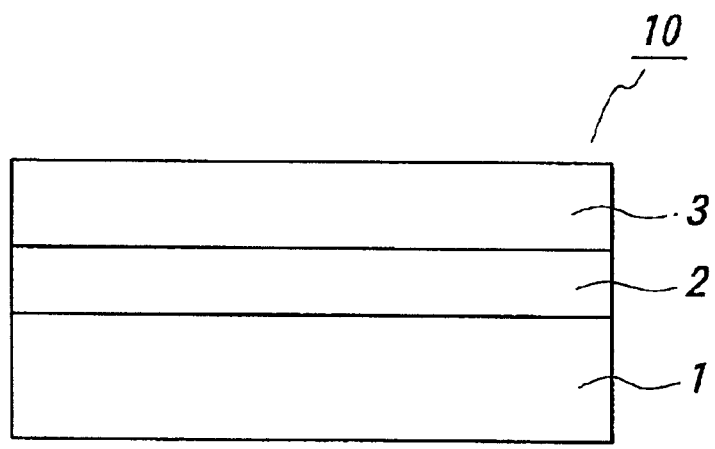
FIG. 3 is a side view of an epitaxial substrate according to the present invention.

This invention will be described in detail, hereinafter. FIG. 3 is a side view showing an epitaxial substrate according to the present invention.

In FIG. 3, an epitaxial substrate 10 includes a base 1 made of a single crystal material, a III nitride buffer film 2 including Al element which is formed on the base 1, and a III nitride underfilm 3 which is formed on the buffer film 2. Herein, the epitaxial base substrate is composed of the base 1 and the buffer film 2.

The base 1 may be made of oxide single crystal such as sapphire single crystal, ZnO single crystal, LiAlO$_2$ single crystal, $LiGaO_2$ single crystal, $MgAl_2O_4$ single crystal, or MgO single crystal, IV single crystal or IV-IV single crystal such as Si single crystal or SiC single crystal, III-V single crystal such as GaAs single crystal, AlN single crystal, GaN single crystal or AlGaN single crystal, and boride single crystal such as $ZrB_2$.

It is required that the screw-type dislocation density of the buffer film 2 is set to $1 \times 10^8/cm^2$ or below, preferably $1 \times 10^7/cm^2$ or below, more preferably $1 \times 10^6/cm^2$ or below. Thereby, the buffer effect and the warping inhibition are given to the epitaxial substrate 10. As a result, even though various III nitride films are formed on the epitaxial substrate 10, the warpage of the thus obtained multilayered structure can be inhibited.

The screw-type dislocation density can be observed and measured by a TEM in the operation of dark field image observation at g=[000 1].

It is desired that the buffer film 2 includes 50 atomic percentages or over of Al element for all of the III element, particularly is made of AlN (100 atomic percentages of Al element). If the buffer film 2 includes a large amount of Al element, as mentioned above, the crystal quality of the buffer film 2 can be developed, and thus, the buffer effect and the warping inhibition can be enhanced.

The buffer film may include other III elements such as Ga element and In element, in addition to Al element. Also, the buffer film may include an additive element such as Ge, Si, Mg, Zn, Be, P or B as occasion demands, and a minute impurity such as O or C contained in the raw material gases and the reactor or contained dependent on the forming condition.

The buffer film 2 of high crystal quality may be made by a MOCVD method, using a trimethylaluminum (TMA) or a triethylaluminum (TEA) as an Al raw material gas and an ammonia as a N raw material gas. The thicker buffer film 2 may be made by a HVPE method in which metallic Al elements are transported with a hydrogen chloride-based gas or the combination of a MOCVD method and a HVPE method.

In this case, some conditions such as (V raw material gas/III raw material gas) flow rate ratio, supply amount of raw material gas, substrate temperature, forming pressure, gas flow rate, gas species and forming rate are appropriately adjusted.

Preferably, the buffer film 2 is formed at a temperature of 1100° C. or over, particularly within 1100–1250° C. through the adjustment of substrate temperature. In this case, even though other conditions are varied within a wide range, the buffer film 2 of low dislocation density and thus, high crystal quality can be obtained easily.

Such a temperature range is extremely higher than a conventional one of 500–700° C.

If Ga element and/or In element is incorporated in the buffer film 2, a Ga raw material gas, e.g., trimethylgallium and/or an In raw material gas, e.g., trimethylindium are supplied with an Al raw material gas and a N raw material gas onto the base 1, to form the buffer film 2 having Ga element and/or In element.

The thickness of the buffer film 2 depends on the sorts of the base 1 and the underfilm 3 and the forming condition thereof. In view of the heat emission of the resulting semiconductor element, the buffer film 2 is formed thicker. In view of fabrication cost, the buffer film 2 is formed thinner. Generally, the thickness is set within 0.1–100 μm.

Similarly, the thickness of the underfilm 3 also depends on the forming condition and the sort and the configuration of the resulting semiconductor element, and generally set within 0.1–100 μm.

The underfilm 3 is epitaxially grown on the buffer film 2 by a MOCVD method. In the case of fabricating a light-emitting element by stacking Ga-including nitride films, it is desired that the underfilm 3 also include Ga element. However, the underfilm 3 may include Al element and/or In element, and an additive element such as B, as mentioned above.

If the underfilm 3 includes a large amount of Ga element and the buffer film 2 includes a large amount of Al element, the difference in lattice constant between the underfilm 3 and the buffer film 2 may be increased. In this condition, if the buffer film 2 is formed thicker, the warpage of the thus obtained epitaxial substrate 10 is increased due to the large difference in lattice constant. Or some cracks are created in the underfilm 3.

In this case, therefore, it is desired that the Al content of the buffer film 2 is continuously or stepwisely inclined in the thickness direction. Concretely, the Al content is continuously or stepwisely decreased from the base 1 toward underfilm 3. Thereby, the difference in lattice constant between the buffer film 2 and the underfilm 3 can be reduced, so the warpage and the creation of crack can be inhibited effectively.

Since the epitaxial substrate 10 includes the buffer film 2 and the underfilm 3 satisfying the requirements as mentioned above, the warpage of the epitaxial substrate 10 can be reduced up to 50 μm or below, particularly 30 μm or below.

Therefore, when various nitride films are formed on the epitaxial substrate 10, to fabricate a given multilayered structure, photolithograph step, etc., requiring precise working ability can be performed precisely. As a result, the manufacturing yielding ratio of semiconductor element can be developed.

The warpage may be measured by a probe-type or an optics-type shape measuring instrument.

EXAMPLES

This invention will be concretely described hereinafter.

Example

A substrate made of c-faced sapphire single crystal was employed, and then, set on a susceptor installed in a reactor. A TMA and an $NH_3$ were used as an Al raw material gas and an N raw material gas, respectively. Then, the TMA and the $NH_3$ were introduced into the reactor and supplied onto the substrate, on the condition of the (V raw material gas/III raw material gas) flow rate ratio of 450 and the forming pressure of 15 Torr. Thereafter, the substrate was heated to 1200° C., and an AlN film as a buffer film was formed in a thickness of 1 μm on the substrate.

The full width at half maximum in X-ray rocking curve at (0002) reflection was 60 seconds, and the good crystal quality of the AlN film was confirmed. The surface roughness Ra was 2 Å, and the good flatness of the AlN film was also confirmed. Moreover, the screw-type dislocation density of the AlN film was $1 \times 10^7/cm^2$.

Thereafter, the forming pressure was varied to atmospheric pressure, and the temperature of the substrate was set to 1050° C. Then, a TMG was introduced with the TMA and the $NH_3$ into the reactor, and supplied onto the substrate, on the condition of the (V raw material gas/III raw material gas) flow rate ratio of 1000, and an AlGaN film as an underfilm was formed in a thickness of 3 μm, to fabricate an epitaxial substrate.

When the warpage of the epitaxial substrate was measured by a shape measuring instrument, it was turned out to be 15 μm.

Comparative Example

Except that the AlN film was formed in a thickness of 0.03 μm, on the condition of the forming temperature of the AlN film being varied to 700° C. from 1150° C., the (V raw material gas/III raw material gas) flow rate ratio being set to 1000, and the forming pressure being set to 760 Torr, the epitaxial substrate was fabricated in the same manner as in Example.

The screw-type dislocation density of the AlN film was $1\times10^9/cm^2$, and the warpage of the epitaxial substrate was 60 μm.

As apparent from Example and Comparative Example, in the epitaxial substrate including the AlN film of low dislocation density, according to the present invention, the warpage can be reduced to 50 μm or below, so that the epitaxial substrate can be preferably used for various semiconductor elements.

Although the present invention was described in detail with reference to the above examples, this invention is not limited to the above disclosure and every kind of variation and modification may be made without departing from the scope of the present invention. For example, a given nitriding treatment may be performed on the main surface of the substrate before the buffer film is formed, as described before. Moreover, the buffer film and the underfilm may be formed by using their respective different CVD apparatuses.

What is claimed is:

1. An epitaxial base substrate, comprising:
   a base made of a single crystal material; and
   a Group III nitride film including at least elemental Al and having a screw-type dislocation density up to $1\times10^8/cm^2$ formed on said base, wherein said Group III nitride film including at least elemental Al is formed directly on said base.

2. An epitaxial substrate, comprising:
   a base made of a single crystal material;
   a Group III nitride buffer film including at least elemental Al and having a screw-type dislocation density up to $1\times10^8/cm^2$ formed on said base; and
   a Group III nitride underfilm formed on said Group III nitride buffer film,
   wherein said Group III nitride film including at least elemental Al is formed directly on said base.

3. An epitaxial base substrate as defined in claim 1, wherein said Group III nitride film includes at least 50 atomic percent of elemental Al for all of the Group III elements in the Periodic Table.

4. An epitaxial base substrate as defined in claim 3, wherein said Group III nitride film is made of AlN.

5. An epitaxial base substrate as defined in claim 1, wherein said Group III nitride film is formed at a temperature of at least 1100° C. by a MOCVD method.

6. An epitaxial base substrate as defined in claim 5, wherein said Group III nitride film is formed within a temperature range of 1100–1250° C.

7. An epitaxial base substrate as defined in claim 1, wherein the elemental Al content of said Group III nitride film is continuously or stepwisely decreased in the thickness direction from said base toward the outside.

8. An epitaxial base substrate as defined in claim 1, wherein the warpage of said epitaxial base substrate is reduced up to 50 μm.

9. An epitaxial substrate as defined in claim 2, wherein said Group III nitride buffer film includes at least 50 atomic percent of elemental Al for all of the Group III elements in the Periodic Table.

10. An epitaxial substrate as defined in claim 9, wherein said Group III nitride buffer film is made of AlN.

11. An epitaxial substrate as defined in claim 2, wherein said Group III nitride buffer film is formed at a temperature of at least 1100° C. by a MOCVD method.

12. An epitaxial substrate as defined in claim 11, wherein said Group III nitride buffer film is formed within a temperature range of 1100–1250° C.

13. An epitaxial substrate as defined in claim 2, wherein said Group III nitride underfilm includes at least Ga element.

14. An epitaxial substrate as defined in claim 13, wherein the elemental Al content of said Group III nitride buffer film is continuously or stepwisely decreased in the thickness direction from said base toward said Group III nitride underfilm.

15. An epitaxial substrate as defined in claim 13, wherein the warpage of said epitaxial substrate is reduced up to 50 μm.

16. An epitaxial base substrate as defined in claim 1, wherein said screw-type dislocation density is less than $1\times10^8/cm^2$.

17. An epitaxial base substrate as defined in claim 10, wherein said screw-type dislocation density is up to $1\times10^7/cm^2$.

18. An epitaxial substrate as defined in claim 2, wherein said screw-type dislocation density is less than $1\times10^7/cm^2$.

19. An epitaxial substrate as defined in claim 18, wherein said screw-type dislocation density is up to $1\times10^7/cm^2$.

* * * * *

UNITED STATES PATENT AND TRADEMARK OFFICE
CERTIFICATE OF CORRECTION

PATENT NO. : 6,759,715 B2
DATED : July 6, 2004
INVENTOR(S) : Tomohiko Shibata et al.

It is certified that error appears in the above-identified patent and that said Letters Patent is hereby corrected as shown below:

Title page,
Item [75], Inventors, change "Kasugia" to -- Kasugai --

Column 1,
Line 40, change "films" to -- film --

Column 6,
Lines 7 and 26, change "C." to -- C --
Line 37, change "13" to -- 2 --
Line 43, change "10" to -- 16 --
Line 47, change "$1 \times 10^7/cm^2$" to -- $1 \times 10^8/cm^2$ --

Signed and Sealed this

Twenty-third Day of November, 2004

JON W. DUDAS
*Director of the United States Patent and Trademark Office*